(12) United States Patent
Kulathu et al.

(10) Patent No.: US 9,322,259 B2
(45) Date of Patent: Apr. 26, 2016

(54) WELLBORE MODELING

(71) Applicant: Dassault Systemes Simulia Corp., Providence, RI (US)

(72) Inventors: Sandeep Kulathu, East Greenwich, RI (US); James Christopher Wohlever, Barrington, RI (US); Zhen-zhong Du, Barrington, RI (US)

(73) Assignee: Dassault Systemes Simulia Corp., Johnston, RI (US)

( * ) Notice: Subject to any disclaimer, the term of this patent is extended or adjusted under 35 U.S.C. 154(b) by 17 days.

(21) Appl. No.: 14/139,471

(22) Filed: Dec. 23, 2013

(65) Prior Publication Data

US 2015/0176400 A1    Jun. 25, 2015

(51) Int. Cl.
*G06G 7/48* (2006.01)
*E21B 43/26* (2006.01)
*G01V 99/00* (2009.01)

(52) U.S. Cl.
CPC .............. *E21B 43/26* (2013.01); *G01V 99/005* (2013.01)

(58) Field of Classification Search
CPC ...................................................... G06F 17/11
USPC ............................................................ 703/10
See application file for complete search history.

(56) References Cited

U.S. PATENT DOCUMENTS

2005/0252286 A1* 11/2005 Ibrahim ............. G01N 33/2823
                                                    73/152.55
2008/0234939 A1*  9/2008 Foot et al. ....................... 702/12
2011/0320047 A1* 12/2011 Stone et al. ................... 700/282

OTHER PUBLICATIONS

Salehi, S.; Nygaard R. "Finite-element analysis of deliberately increasing the wellbore fracture gradient", 2010, American Rock Mechanisms Association, ARMA 10-202, 10 pages.*

Adachi, J. et al., "Computer simulation of hydraulic fractures," *International Journal of Rock Mechanics and Mining Sciences*, 44: 739-757 (2007).

Al-Khoury, R. et al., "Efficient finite element formulation for geothermal heating systems. Part I: Steady state," *International Journal for Numerical Methods in Engineering*, 63: 988-1013 (2005).

Al-Khoury, R. et al., "Efficient finite element formulation for geothermal heating systems. Part II: Transient," *International Journal for Numerical Methods in Engineering*, 67: 725-745 (2006).

Bhat, A. et al., "Coupling the Hola Wellbore Simulator With Tough2," Proceedings, Thirtieth Workshop on Geothermal Reservoir Engineering, Stanford University, Stanford, California, Jan. 31-Feb. 2, 2005, 6 pages.

(Continued)

*Primary Examiner* — Dwin M Craig
(74) *Attorney, Agent, or Firm* — Hamilton, Brook, Smith & Reynolds, P.C.

(57) ABSTRACT

A computer method, apparatus and system simulate hydraulic fracturing. The computer system/method models a wellbore of an injection well. The wellbore model includes a hydraulic drill pipe element in a borehole and related fluid flow in the borehole. The borehole workflow is modeled in a subject rock formation. A simulator operatively coupled to the model obtains pressure values from the modeled borehole workflow and modeled wellbore. The simulator automatically converts pore pressure from the modeled borehole into a mechanical pressure load on the subject rock formation. The mechanical pressure as hydrostatic pressure is automatically applied to the surface of the rock formation affected by the borehole and responsively defines one or more pressure induced fractures. A 2D or 3D graphical representation of the pressure induced fractures in the rock formation are displayed on output.

15 Claims, 21 Drawing Sheets

(56) References Cited

OTHER PUBLICATIONS

Clemo, T., "Coupled Aquifer-Borehole Simulation," *Ground Water*, 48(1): 68-78 (Jan.-Feb. 2010).

Durlofsky, L.J. et al., "Final Report: Advanced Techniques for Reservoir Simulation and Modeling of Nonconventional Wells," Department of Petroleum Engineering, School of Earth Sciences, Stanford University, Stanford, California, Issued: Aug. 20, 2004, 224 pages.

Gudmundsdottir, H. et al., "Coupling Wellbore Simulator With Reservoir Simulator," Proceedings, Thirty-Seventh Workshop on Geothermal Reservoir Engineering, Stanford University, Stanford, California, Jan. 30-Feb. 1, 2012, 9 pages.

Guomundsdottir, H., "A Coupled Wellbore-Reservoir Simulator Utilizing Measured Wellhead Conditions," Faculty of Industrial Engineering, Mechanical Engineering and Computer Science, University of Iceland, 2012, 139 pages.

Hadgu, T. et al., "Coupling of the Reservoir Simulator TOUGH and the Wellbore Simulator WFSA," Earth Sciences Division, Lawrence Berkeley Laboratory, University of California, Berkeley, California, pp. 84-89, Mar. 20-22, 1995.

Jansen, J.D., "Research Report: Expressions for the flow through grid block boundaries near wells in reservoir models with irregular grids," TA Report No. TA/PW/00-002, CTG Report No. CTG/PW/00-002, 30 pages, 2000.

Livescu, S. et al., "A fully-coupled thermal multiphase wellbore flow model for use in reservoir simulation," Journal of Petroleum Science and Engineering, 71: 138-146 (2010).

Pourafshary, P., "A Coupled Wellbore/Reservoir Simulator to Model Multiphase Flow and Temperature Distribution," Presented to the Faculty of the Graduate School of The University of Texas at Austin, Dec. 2007.

\* cited by examiner

TYPICAL WATER INJECTION
CONFIGURATION LAYOUT

21

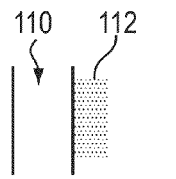 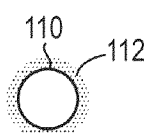 1. WATER 112 IS PUMPED AND SEEPS INTO ROCK UNDER "MATRIX" FLOW (I.E., BELOW FRACTURE PRESSURE)

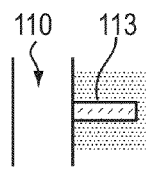 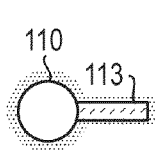 2. WATER RATE AND/OR PRESSURE INCREASE AND FRACTURE 113 IS INITIATED; NEAR-WELL PLUGGING COULD CONTRIBUTE TO PRESSURE INCREASE

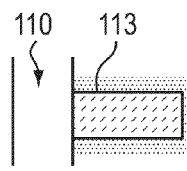 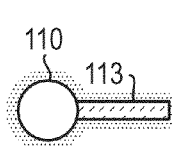 3. FRACTURE 113 PROPAGATES WITH SOME FLUID LEAK-OFF TO FORMATION THROUGH FRACTURE FACE; PLUGGING OF FRACTURE FACE COULD CONTRIBUTE TO LEAK-OFF PROFILE ALONG FRACTURE LENGTH

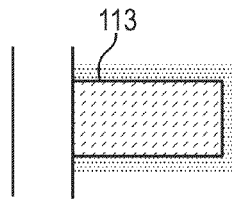 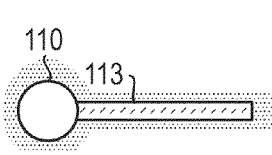 4. FRACTURE 113 EITHER REACHES EQUILIBRIUM STATE OR CONTINUES PROPAGATING DEPENDING ON RATE AND PRESSURE CONDITIONS

SIDE VIEW OF BOREHOLE 110 AND FRACTURE 113

CROSS-SECTION OF BOREHOLE 110

WATER INJECTION

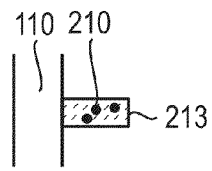 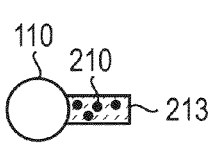
1. HIGH VISCOSITY SLURRY 210 OF FLUID AND DRILL CUTTINGS INITIATES FRACTURE 213

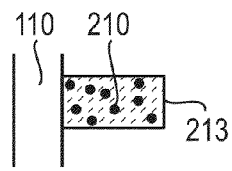 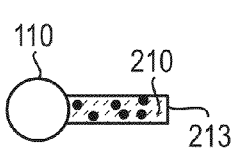
2. SLURRY PROPAGATES FRACTURE 213 WITH MINIMAL LEAK-OFF TO FORMATION

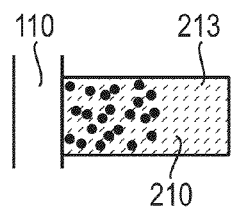 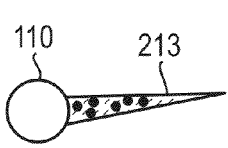
3. INJECTION IS STOPPED AND FRACTURE 213 PARTIALLY CLOSES

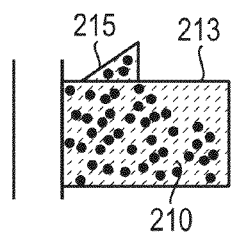 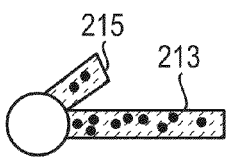
4. INJECTION RESUMES WITH POTENTIAL TO INITIATE SECOND FRACTURE 215, DEPENDING ON NEAR-WELL STRESS EFFECTS FROM ORIGINAL FRACTURE 213

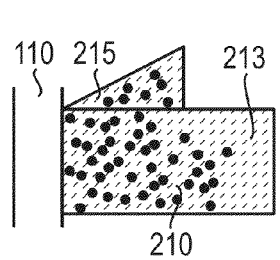 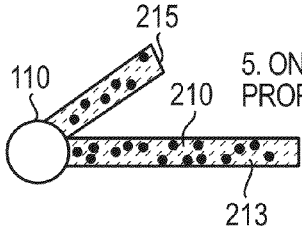
5. ONE OF BOTH FRACTURES 213, 215 PROPAGATE AS INJECTION CONTINUES

DRILL CUTTINGS INJECTION

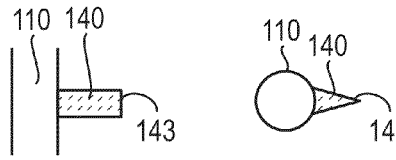
1. DRILLING FLUID 140 INITIATES FRACTURE 143

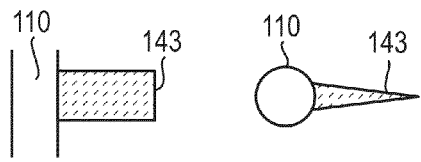
2. RATE AND PRESSURE ARE ADJUSTED TO MINIMIZE FRACTURE 143 PROPAGATION

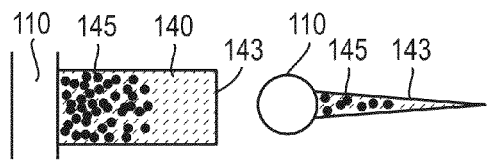
3. DEPENDING ON SEVERITY OF FRACTURE 143 PROPAGATION AND DRILLING FLUID 140 LOSSES TO FORMATION, DRILLING IS PAUSED AND PARTICLES 145 ARE INTRODUCED INTO SYSTEM IN ATTEMPT TO BLUNT FRACTURE AND BLOCK ADDITIONAL FLUID LOSSES

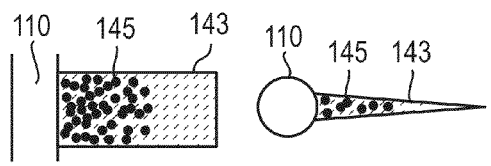
4. DRILLING RESUMES AND FRACTURE 143 EITHER PROPAGATES OR IS ARRESTED DEPENDING ON STRESS STATE, FLOW CONDITIONS, AND EFFECTIVENESS OF PARTICLE PACK 145 INSIDE FRACTURE 143

DRILLING LOST RETURNS

FIG. 4

21
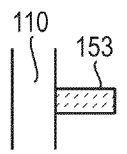 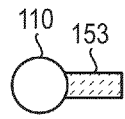
1. FLUID IS PUMPED AND INITIATES FRACTURE 153
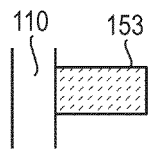 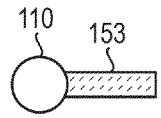
2. FLUID PROPAGATES FRACTURE 153
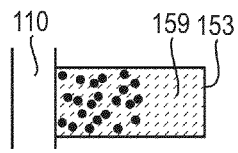 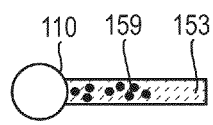
3. PUMPING CONTINUES WITH INTRODUCTION OF FLUID/ PARTICLE SLURRY 159 FRACTURE CONTINUES PROPAGATING WHILE PARTICLES ARE CARRIED INTO FRACTURE
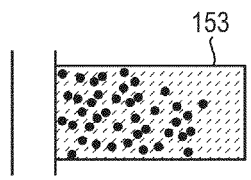 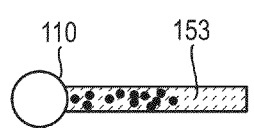
4. PUMPING IS STOPPED
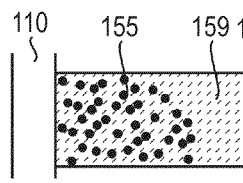 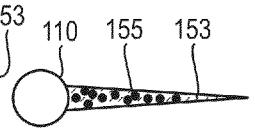
5. PUMP PRESSURE IS RELIEVED AND FRACTURE 159 IS COMPRESSED, BUT IS PROPPED OPEN BY PARTICLES 155 IN SLURRY 159
FRACTURE STIMULATION
FIG. 5

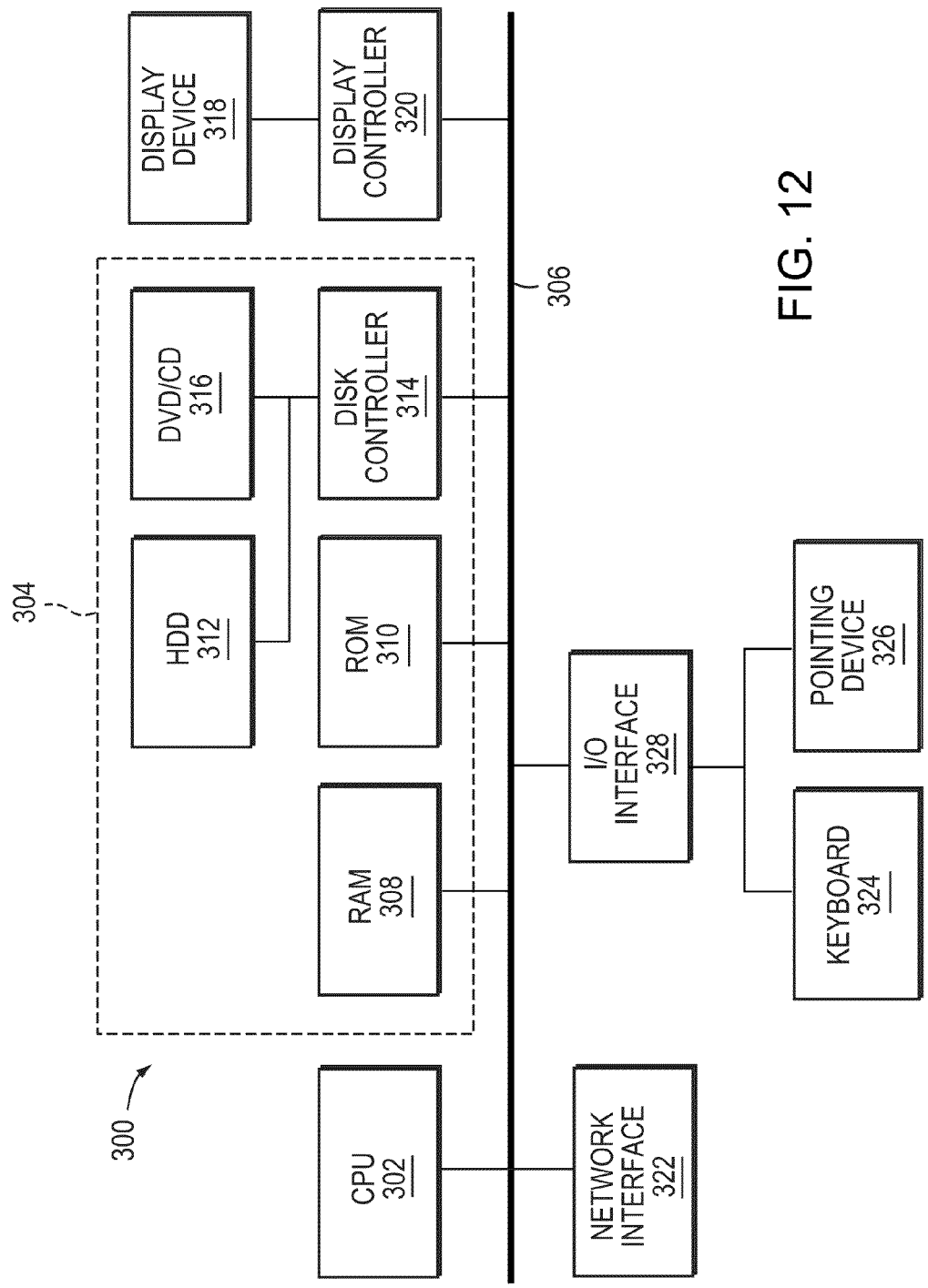

WELLBORE MODELING

FIELD OF THE INVENTION

This invention belongs to the field of Simulation. The one-dimensional (1D) Borehole model workflow can be used to help simulate pressure induced fracture automatically.

BACKGROUND OF THE INVENTION

A number of reservoir simulators and wellbore simulators exist as stand-alone products. The most common way of coupling a wellbore simulator and reservoir simulator is by means of well productivity index. The wellbore simulators are based on a finite difference scheme and solve the Navier Stokes equation. Using the pressures obtained from the wellbore simulation, a productivity index (PI) or Well Index (WI) can be determined. This PI is used as an input to the reservoir simulator. Some of the assumptions that are made in the coupling include flow being vertical and upward, or using a predetermined table of temperature and pressures. Another approach involves treating the wellbore as a point source in a reservoir and using a Peaceman solution to determine the pressure distribution inside a grid block.

Temperature coupling between wellbore and reservoir is used to model geothermal systems where the field of interest is the fluid temperature. There is no mixing of fluids between the reservoir and wellbore.

Generally, there has been no attempt to drive a fracture in the reservoir by means of the pressures being tied between the wellbore and the rock formation.

SUMMARY OF THE INVENTION

The focus of the present invention is to help enable a series of workflows relevant to hydraulic fracturing which are very important to the oil and gas industry. Hydraulic fracturing (fracking) is the process of inducing fracture in rock using fluids pumped in at high pressure. It is an enabling technology for extracting natural gas from shale rock and is poised for significant growth in the oil and gas industry over the next 20-30 years. Embodiments of the invention enhance simulation tools for hydraulic fracturing. To provide a focus to this work, the embodiments described herein identify four common drilling workflows which are of immediate concern to members of the industry: (1) water injection; (2) drill cutting injections; (3) drilling wellbore integrity and lost returns; and (4) fracture stimulation.

To give some frame of reference, a brief description of these workflows is provided below. From a simulation point-of-view a common thread in these workflows is the need to model hydraulically induced fracture in the formation, i.e., the rock, caused by fluid pumped in under high pressure. Embodiments of the present invention are designed to provide a set of tools to help enable these types of models and simulations.

In one embodiment a computer method of simulating hydraulic fracturing is provided. The method includes modeling a wellbore of a well, including modeling the borehole workflow in a subject rock formation. The method next obtains pressure values from the wellbore model, and automatically simulates pressure induced fracture of the rock formation based on the obtained pressure values. In accordance with one aspect of the present invention, the well is an injection well. The modeling of the wellbore includes modeling a hydraulic drill pipe element (or a series of drill pipe elements) in the borehole, and modeling related fluid flow in the borehole.

In accordance with one aspect of the present invention, the method further comprises automatically coupling fluid continuity and flow equilibrium equations from the drill pipe element to the rock formation. The flow equilibrium equations include flow equilibrium between the borehole and a fracture in the rock formation. The fracture may be represented by an extended finite element method (XFEM) and/or coupled pore pressure cohesive elements (CZM).

In accordance with another aspect of the present invention, embodiments automatically simulate pressure induced fracture by automatically converting pore pressure from the model borehole into a mechanical pressure load on the rock formation exposed to the fluid pressure. The mechanical pressure load may be hydrostatic pressure. Methods of the present invention automatically apply mechanical pressure to a surface of the rock formation affected by the borehole, often resulting in circumferential tensile stress in the rock formation. This in turn defines one or more pressure induced fractures in the rock formation.

Other embodiments include computer apparatus, computer systems and/or computer program products for stimulating hydraulic fracturing employing a computer processor using one or more processors configured to carry out the above method steps and processes.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 1A-1C are schematic views of water injection type drilling workflow.

FIG. 2 illustrates side and cross section views of drill cutting injection.

FIG. 4 shows side views and corresponding cross sections of the borehole and fractures illustrating lost returns.

FIG. 5 shows side views and corresponding cross sections of the borehole and fractures during fracture stimulation.

FIGS. 12 and 13 are block and schematic diagrams of a computer simulation system, apparatus and processing node embodying the present invention.

DETAILED DESCRIPTION OF THE INVENTION

A description of example embodiments of the invention follows.

The teachings of all patents, published applications and references cited herein are incorporated by reference in their entirety.

The advent of CAD and CAE systems allows for a wide range of representation possibilities for objects. One such representation is a finite element analysis (FEA) model. The terms FEA model, finite element (FE) model, finite element mesh, and mesh are used interchangeably throughout this application. A FE model typically represents a CAD model, and thus, may represent one or more parts or an entire assembly. A FE model is a system of points called nodes which are interconnected to make a grid, referred to as a mesh. The FE model may be programmed in such a way that the FE model has the properties of the underlying object that it represents. When a FE model is programmed in such a way, it may be used to perform simulations of the object that it represents. For example, a FE model may be used to represent the interior cavity of a vehicle, the acoustic fluid surrounding a structure, and any number of real-world objects. In embodiments of the present invention, FE models are used to represent wellbores of injection wells and surrounding/affected rock formation. When a given FE model represents an object and is programmed accordingly it may be used to simulate the real-world object itself. In the embodiments described herein, a FE model representing a wellbore and associated rock formation are used to simulate the use of pressure induced or hydraulic fracturing in real-life settings.

With regard to the above-mentioned immediate concerns in the oil and gas industry, there are four common drilling workflows as follows.

Water Injection

Figure 1A:
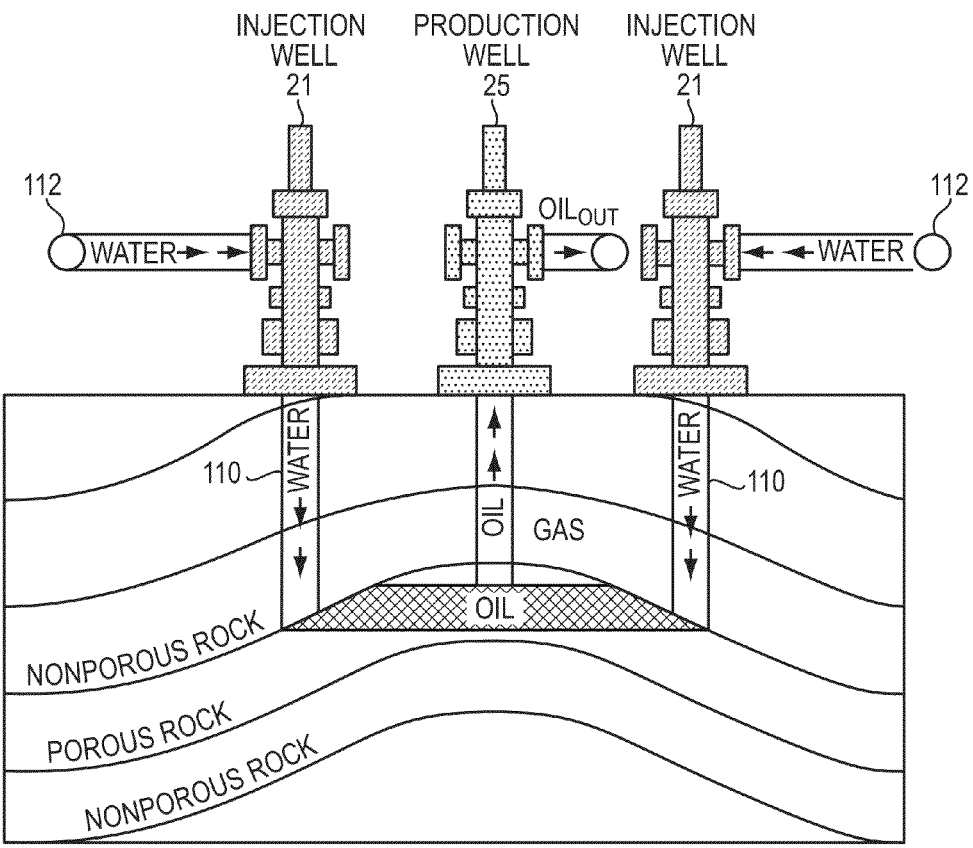
Figure 1B:
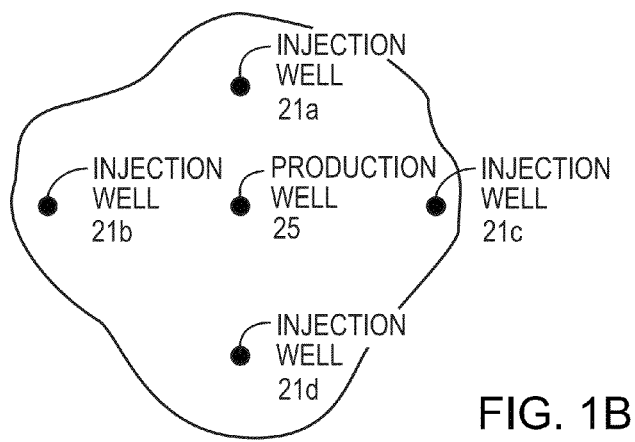

A common scenario for water injection is to maintain reservoir pressure and improve the recovery of hydrocarbons (oils and gas). This is accomplished by using injection wells 21a, b, c, d (generally 21) and production wells 25 which are drilled in relative proximity to each other as illustrated in FIGS. 1A-1B. Filtered water 112 is pumped into the injection well(s) 21 in order to maintain pressure in the reservoir to help maximize production. Ideally, injection wells 21 run continuously in a steady state condition for 20 years or more. In a typical "5-spot" pattern where injection wells 21a, b, c, d are placed at 5/16 acre intervals (shown in FIG. 1B), it takes about 5 years before the pressure fields of neighboring wells 21, 25 begin to interact and the wells "feel" each other.

Figure 6:
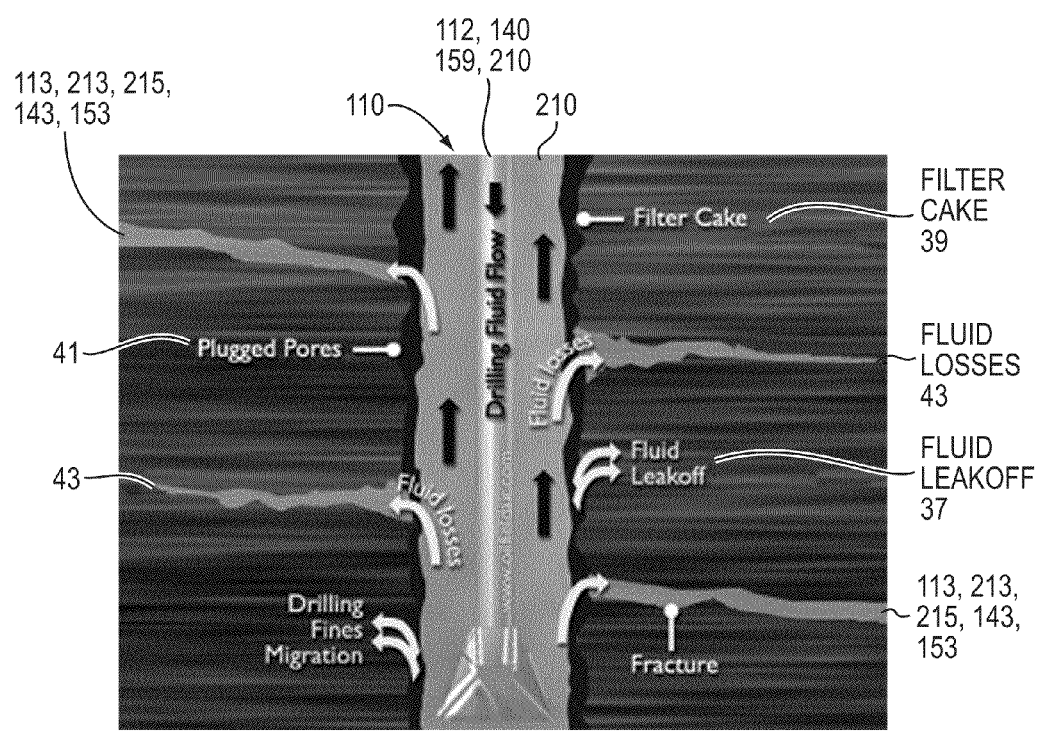
FIG. 6 is a schematic illustration of wellbore drilling.

To maintain pressure in the reservoirs, the flow rate of the water 112 into the injection wells 21 must be approximately the same as the flow rate of hydrocarbons out of the production well 25. A typical flow rate is 20,000 barrels per day. However, even though the water 112 is cleaned before injection, filter cake 39 (shown in FIG. 6) builds up over time (approximately one year) on the injection well 21 walls plugging pores 41 (FIG. 6) and impedes the flow of water 112 into the surrounding matrix (fluid leak off 37, FIG. 6). Since a constant mass flow rate is maintained into the injection well 21 the caking leads to a corresponding increase in pressure in the wellbore 110 which can lead to unwanted hydraulic fracture 113 as illustrated in FIG. 1C. This fracture 113 is identified by a corresponding drop in pressure at the well head of the injection well 21.

The filter cake 39 occurs in the form of schmoo—an oil-industry term for small particles covered in hydrocarbons, dust, and organic material. Filtration of the injection water 112, even down to 1 micron, does not seem to alleviate the caking problem.

With reference to FIG. 1C a water injection workflow is outlined as follows. The left-hand column of the figure shows side views of the borehole 110 and fracture 113 while the center column of the figure shows the corresponding cross section of the borehole 110 and fracture 113. In an initial step of the water injection workflow, water 112 is pumped into the injection well 21 and may seep into the rock formation under matrix flow (i.e., below fracture pressure). In a next stage, the water rate and/or pressure increase and fracture 113 is initiated. Plugging of the pores 41 (FIG. 6) near the well 21 may contribute to this increase of pressure. Eventually the fracture 113 propagates with some fluid leak off 37 (FIG. 6) to the surrounding rock formation through the fracture face. Plugging of the fracture face could contribute to a leak-off profile along the fracture 113 length. In a last stage, the fracture 113 either reaches an equilibrium state or continues propagating depending on rate and pressure conditions of borehole 110.

When fracture 113 occurs in the injection well 21, the fracture 113 typically leads to a single fracture as opposed to the multiple fractures which occur in the drill cuttings injection operation. One possible reason for a single fracture 113 is the fact that the pressure is constantly maintained during water injection which is not the case in drill cuttings injection.

Once fracture 113 occurs it seems to reoccur on a regular basis—on the order of a day.

It is believed that upon fracture 113 the existing filter cake (schmoo) 39 mostly sticks to the current exposed fracture surfaces and does not propagate to the newly created fracture surfaces. The newly exposed surface is eventually covered by new schmoo.

Current simulation codes cannot model the fracturing process: the transition from "matrix flow" to crack initiation. This is where the present invention can bring real value to this analysis.

Drill Cutting Injection

Two byproducts of a drilling operation are drilling fluids and drill cuttings. Drilling fluids are used during the drilling process to cool and lubricate the drill bit as well as to bring drill cuttings up to the surface. Viscosifiers may be added to the drilling fluid to enhance its ability to transport cuttings. Drill cuttings are pieces of rock ground up by the drill bit. The resulting fluid 210 (FIG. 2) is a "viscosified" mixture which behaves as a non-Newtonian fluid.

FIG. 2 illustrates drill cutting injection of an injection well 21. The left column of the drawing is a side view of the well borehole 110 and fractures 213, 215. The middle column is a corresponding cross-section view of the borehole 110 and fractures 213, 215. A high viscosity slurry 210 of drilling fluids and drill cuttings involved in the drilling process initiates a first fracture 213. The slurry 210 is shown propagating fracture 213 with minimal leak-off 37 (FIG. 6) to the formation. When injection drilling stops, fracture 213 partially closes as illustrated in the middle row of FIG. 2. When injection drilling resumes, a second fracture 215 may be initiated depending on near-well stress effect from the original fracture 213. The first and second fractures 213, 215 propagate as injection continues.

Drilling fluids and drill cuttings in 210 must eventually be disposed of. One way this is accomplished is by drilling a new wellbore 110 into a target formation, hydraulically fracturing the formation, and injecting the waste drilling fluids and drill cuttings into the new fractures. When the current batch of waste has been injected into the formation the injection process is stopped and the pressure in the well 21 slowly drops as the fluid diffuses into the rock. This process is repeated as many times as needed, typically with three-week intervals between injections.

Cuttings are sometimes injected into a layer of sand, or into shale adjacent to a layer of sand.

Unlike the single fracture that occurs in the water injection case, drill cutting injection tries to induce multiple fractures 213, 215 in different directions about the wellbore 110 as seen in FIG. 2. With each injection, it is desirable to create a new fracture 215 and limit the growth of old existing fractures 213. It has been postulated that the different fracture directions are due to the fact that after a batch of drilling waste is injected into the formation the pressure is removed and the fractures are allowed to close upon the drill cuttings. One theory is that this changes the stress field around the borehole 110 in such a way that when the hole is re-pressurized the new stress field favors a new crack initiating at an angle to the existing crack(s). Understanding and being able to model this phenomenon would bring value to the industry.

A possible modeling strategy may include creating an initial fracture using XFEM (Extended Finite Element Modeling); de-pressurizing the borehole 110 and artificially keep the crack from closing up by adjusting the contact definitions; and re-pressurizing the borehole 110 and see if a new crack initiates in another direction instead of further propagating the existing crack.

Key questions to be answered by simulation include how long to wait before injecting another batch, and how is the near-bore stress state altered by a propped-open fracture.

Drilling Wellbore Integrity/Lost Returns

Figure 3:
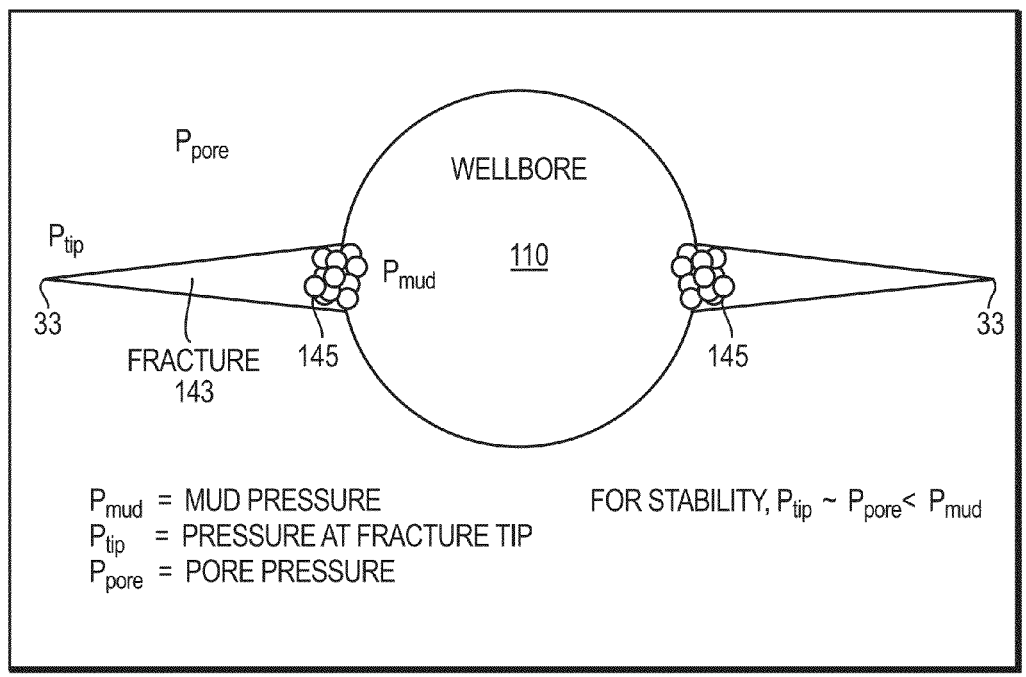
FIG. 3 is a schematic view of drilling wellbore integrity and lost returns.

Turning to FIGS. 3 and 4, the drilling process involves pumping fluid 140 down the drill pipe, through the bit, and back up between the drill pipe and well casing to the surface. The fluid 140 cools the drill bit and transports cuttings back to the surface.

The fluid/cuttings mixture is at atmospheric pressure as it leaves the wellhead, so the pressure distribution inside the well casing is hydrostatic. This pressure depends on the density of the fluid/cuttings mixture, which can be augmented by adding "drill mud" at the inlet of the drill pipe. The drill fluid 140 itself behaves as a non-Newtonian material with temperature dependent viscosity.

During the drilling process the hydrostatic pressure near the drill bit can increase enough that undesirable fractures 143 can occur in the wellbore 110 itself. This can lead to significant amounts of drilling fluid 140 being lost into the formation rather than being re-circulated back up the wellbore 110. Such fluid 140 loss is referred to as lost returns (illustrated at 43 in FIG. 6).

The first goal of operators is to prevent fractures 143 (FIGS. 3 and 4) in the wellbore 110. If a fracture 143 does occur, there are several techniques which can be used to minimize the extent of the fractures and resulting loss of returns 43. One of these techniques is referred to as Fracture Closure Stress Technique in which the fracture 143 opening is enlarged and propped open with loss control materials (LCMs) 145 as shown in FIGS. 3 and 4. Propping open the fracture 143 increases the near-wellbore hoop stresses and thus increases its resistance to further fracture at other places around the wellbore 110—this is referred to as the stress cage concept.

Building a stress cage is the second goal of drill operators. The LCMs 145 which prop open the fracture 143 can also serve as a flow reducing "bridge" structure which helps to isolate the crack tip 33 (FIG. 3) from the high pressures in the wellbore 110 which helps to prevent further propagation at the tip 33. This phenomenon occurs in two distinct cases: Permeable Formation and Non-Permeable Formation.

In Permeable Formation, the rock permeability is high enough that flow can transport LCMs 145 into the fracture 143. Once the bridge structure forms, pressure at the fracture tip 33 is relieved as fluid seeps into the rock, and a pressure gradient is established across the bridge. The LCM process is very effective in this case.

In Non-Permeable Formation, it is difficult to form a bridge in the fracture 143. Instead, the goal is to block the fracture opening using larger LCM particles 145. This process is not very successful in practice.

As illustrated in FIG. 4, at the last stage of the drilling lost returns workflow, drilling resumes and fracture 143 either propagates or is arrested depending on stress state, flow conditions, and effectiveness of the particle pack/LCMs 145 inside fracture 143.

Computational Fluid Dynamics (CFD) and particle transport seem to be important to the correct modeling of Drilling Wellbore Integrity. Propagation of the crack (fracture 143) during this analysis would be a key differentiator. CFD should also predict the evolution of permeability on the fracture surface as layers of particles 145 build up.

Others in the art can model aspects of the above using CFD codes such as Fluent and Star-CD. However, they cannot model a propagating crack/fracture 143.

Fracture Stimulation

The goal of fracture stimulation is to increase the production of hydrocarbons from a reservoir (target formation.) It does this by increasing the permeability of the reservoir by hydraulically fracturing the rock. As shown in FIG. 5, this is achieved by pumping fracturing fluid (part of slurry 159) into the target formation with pressure high enough to overcome both the confining hydrostatic pressure of the overlying geologic structures as well as the tensile strength of the rock.

The fracturing fluid is also used to carry proppant 155 (as a fluid-particle slurry 159) into the fractures 153. The fracture 153 continues to propagate while particles 155 are carried into the fracture 153. The role of the proppant 155 is to keep the fractures 153 open and thus keep the effective permeability high.

The fluid (part of slurry 159) is pumped into an otherwise closed well (no recirculation). Pressure is applied to the formation selectively by inserting a plug in the bore 110, then a device which creates one inch diameter perforations in the casing at the desired location for fracture.

This technique is often used in shale which contains a network of natural fractures. These fractures are "open" and filled with either natural gas (the target material) or water (unwanted).

In some cases the fracturing fluid (part of slurry 159) is a viscous gel-like fluid which is able to hold-up the proppant 155 against gravity and effectively transport it into the fractures 153. However, for economic reasons a low viscosity fluid (referred to as slickwater) is being used more often—especially in shale formations. Due to its low viscosity, the slickwater cannot hold-up the proppant 155 and the particles 155 tend to settle out of the flow. The slickwater technique therefore relies on a higher mass flow rate to move the proppant 155 into the fractures 153. Low viscosity also creates higher leak-off rates (illustrated at 37 in FIG. 6) with slickwater. One theory suggests that slickwater tends to increase the chance to bifurcate cracks, which is a desirable characteristic.

It is unclear if slickwater is always an efficient method for transporting proppant 155—especially into fractures 153 that propagate vertically from a horizontal well. This requires a two stage analysis for the fracture 153 growth problem and the proppant 155 transport problem.

For first order simulation, it is reasonable to model only a section of the bore 110 near the fracture 153, and assume that the proppant 155 concentration in the bore is equal to that at the wellhead.

With slickwater, "dunes" of particles 155 tend to form inside a crack. These are then "blown" down the crack by the fluid flow. Experiments with flow between flat plates have demonstrated this phenomenon.

Another phenomenon needing simulation is the process of particles 155 flowing along the wellbore 110 and then turning and entering a fracture 153. The particles 155 must flow through a one inch perforation hole. One knows the flow rate of water into the crack from the wellhead inlet conditions, but does not know the flow rate of particles 155 in the crack since some may settle out of the flow.

Figure 14:
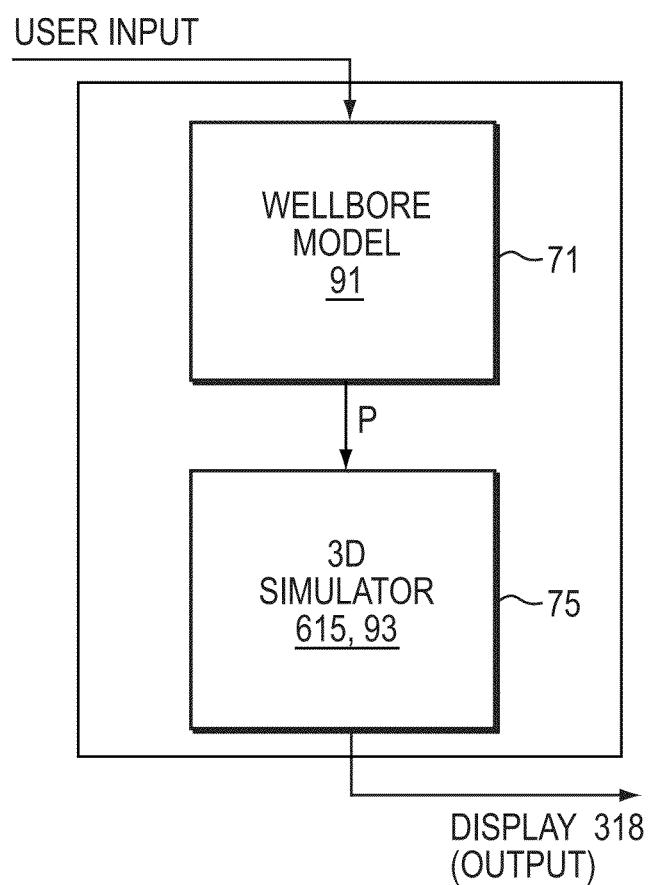
FIG. 14 is a block diagram of one embodiment.

Embodiments of the present invention simulate pressure induced fracture (or hydraulic fracturing) by modeling one or more borehole 110 workflows such as the above reviewed workflows. In an example embodiment illustrated in FIG. 14, a computer simulation system 100 employs a wellbore modeler 71 and a 3D simulator 75. Through the wellbore modeler 71, computer simulation system 100 models a 1D hydraulic drill pipe element 91 (or series of pipe elements) and the associated (related) fluid flow in the borehole 110 as illustrated in FIG. 11E. The simulation system 100 uses pressures (P values) from the resulting wellbore model 71 as input to 3D simulator 75 to simulate the surrounding rock formation 615. Simulator 75 applies the wellbore model 71 pressures and illustrates fracture 93 formation and propagation in the reservoir.

The simulation system 100 uses constraint equations (referred to as tie constraints and *EMBEDDED ELEMENT detailed below) to automatically couple fluid continuity and flow equilibrium equations from the drill pipe element 91 to the subject rock formation 615. The flow equilibrium equations include flow equilibrium between a pure pore pressure regime (the modeled borehole 110) and a coupled pore pressure displacement regime (the rock formation 615). The flow equilibrium equations also include flow equilibrium between the pure pore pressure regime (the modeled borehole 110) and a fracture 93 using Extended Finite Element Method (XFEM) or cohesive zone (a finite element mesh coupled with pore pressure cohesive elements).

In turn, the 3D simulator 75 automatically converts pore pressure from the modeled borehole 110 into a mechanical pressure load (hydrostatic pressure) on the subject formation 615. A distributed surface loading feature automatically applies the mechanical hydrostatic pressure for the formation surface 61 affected by the borehole 110 using the simulation solution dependent pore pressure (degrees of freedom). This generates an association (and automatic application) of pore pressure from the borehole 110 to fractures 93 (cracks) in the formation 615.

FIGS. 11A-11D illustrate a number of relevant modeling scenarios with the pipe elements 91 employed in the wellbore model 71. Each pipe element 91 is defined by a diameter, a friction factor, finite element mesh model coordinates (x, y, z) of the pipe ends, and pressure and/or flow rate at pipe element inlet and outlet ($P_{in}$, $Q_{in}$, $P_{out}$, $Q_{out}$). The wellbore model 71 models each pipe element 91 at steady state with the assumption that the pipe element 91 is fully filled with fluid at all times. Behavior of the pipe element 91 thus follows Bernoulli's equation.

Bernoulli's equation between two end points of the pipe element 91 can be written as:

$$\frac{P_1}{\rho g} + \frac{V_1^2}{2g} + Z_1 = \frac{P_2}{\rho g} + \frac{V_2^2}{\rho g} + \frac{V_2^2}{2g} + Z_2 + C_L \frac{V_a^m}{2g} \quad \text{(EQ. 1)}$$

where,
$P_1$, $P_2$ are pressures at the nodes (pipe ends),
$V_1$, $V_2$ are the fluid velocities at the nodes,
$V_a$ is the average fluid velocity over the pipe element 91,
$Z_1$, $Z_2$ are the elevations at the nodes,
$\rho$ is the density of the fluid in the pipe,
g is acceleration due to gravity,
m=2 is the exponent for Darcy-Weisbach flow loss, and
$C_L$ is the loss coefficient which is defined as $$C_L = \frac{fl}{D}$$

f=friction factor of pipe element 91,
l=length of pipe element 91, and
D=diameter of pipe element.

Since the cross sectional area is constant over a pipe element 91, there is no change in velocity over the element 91. That is, $V_1 = V_2 = V_a$. The mass flow rate Q in pipe element 91 can be related to flow velocity as Q=ρAv, where A is the cross sectional area of the pipe element 91. Using the relationship for loss coefficient and mass flow rates in the Bernoulli's equation, we get:

$$(P_1 - P_2) - \rho g(Z_2 - Z_1) = CQ^m \quad \text{(EQ. 2)}$$

where, $$C = \frac{C_L}{2g} \cdot \frac{\rho g}{(\rho A)^m} \quad \text{(EQ. 3)}$$

Figure 11A:
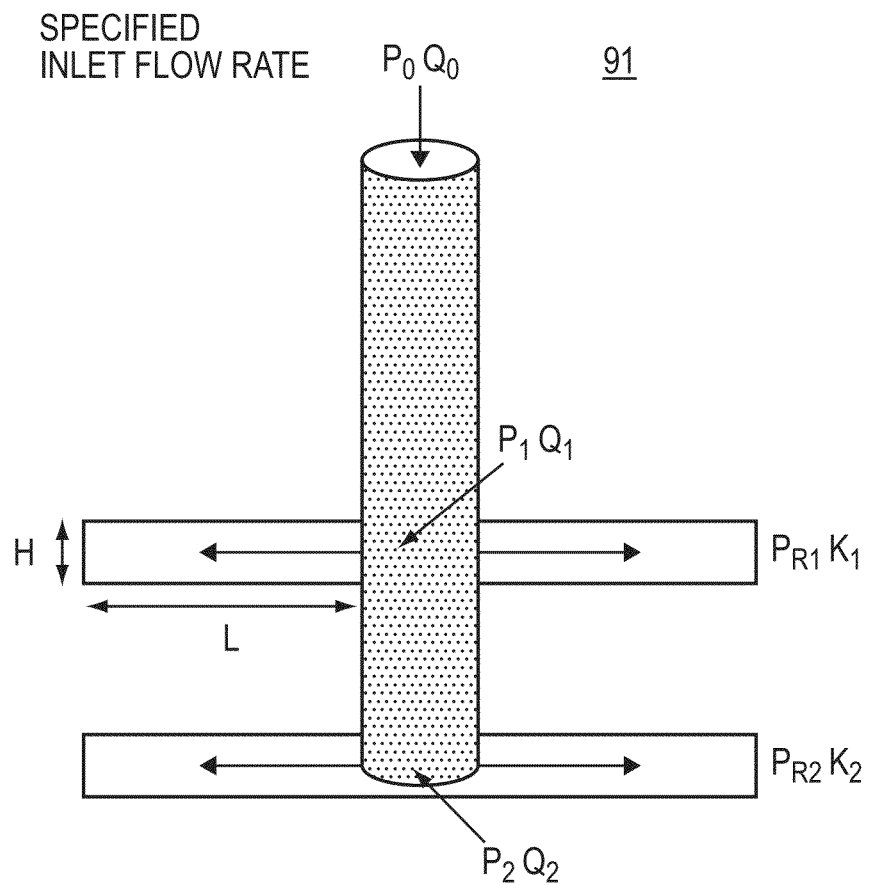
FIGS. 11A-11D are schematic views of pipe elements in wellbore models of the present invention.

FIG. 11A illustrates the pipe element 91 utilized in modeling injection drilling (wellbore model 71) in 2 zones. The model 71 defines pipe element 91 pressure and flow rate ($P_1$, $Q_1$) for a first zone and pressure and flow rate ($P_2$ $Q_2$) for a second zone based on user-specified inlet pressure ($P_0$) or flow rate ($Q_0$). The surrounding rock formation 615 in the model 71 may have constant properties ($P_{R1}$ $K_1$) for the first zone and ($P_{R2}$ $K_2$) for the second zone. Each zone is defined by a height H and a length L (from pipe element 91).

Figure 11B:
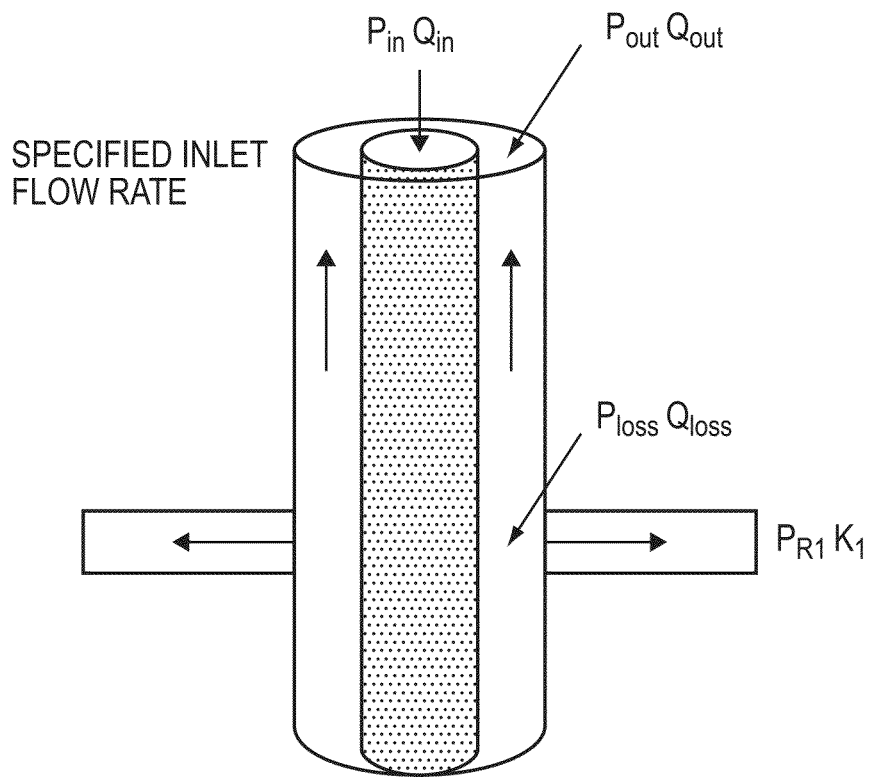

FIG. 11B illustrates the pipe element 91 utilized in modeling lost returns 43 (described above in FIG. 6). The model 71 defines pressure and flow rate at loss points ($P_{loss}$ $Q_{loss}$) based on user-specified pipe outlet pressure ($P_{out}$) or flow rate ($Q_{out}$) and inlet pressure ($P_{in}$) or flow rate ($Q_{in}$). The surrounding rock formation 615 in the model 71 has properties ($P_{R1}$ $K_1$).

Figure 11C:
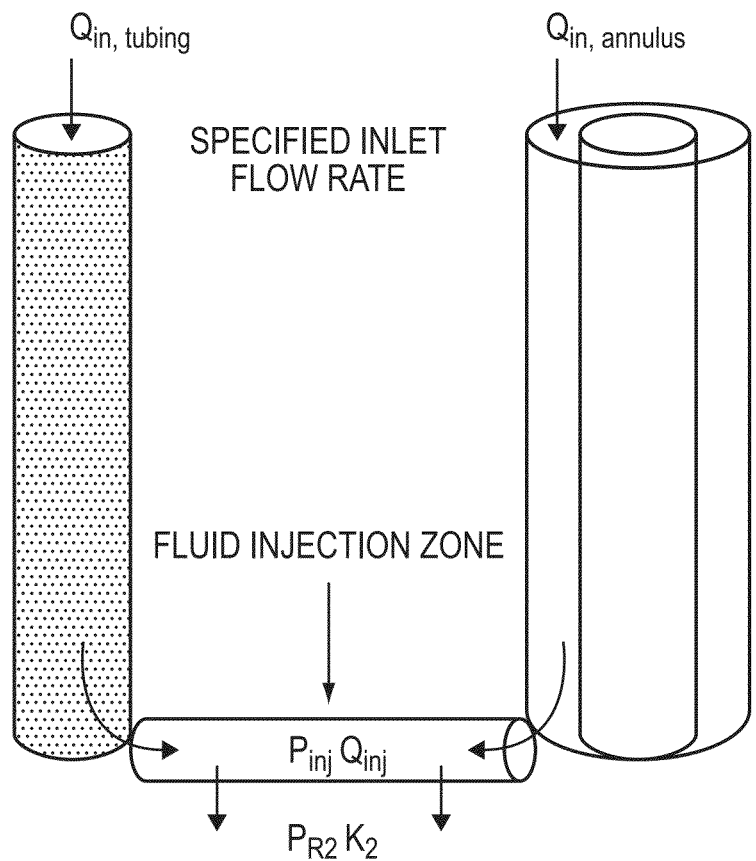
Figure 11D:
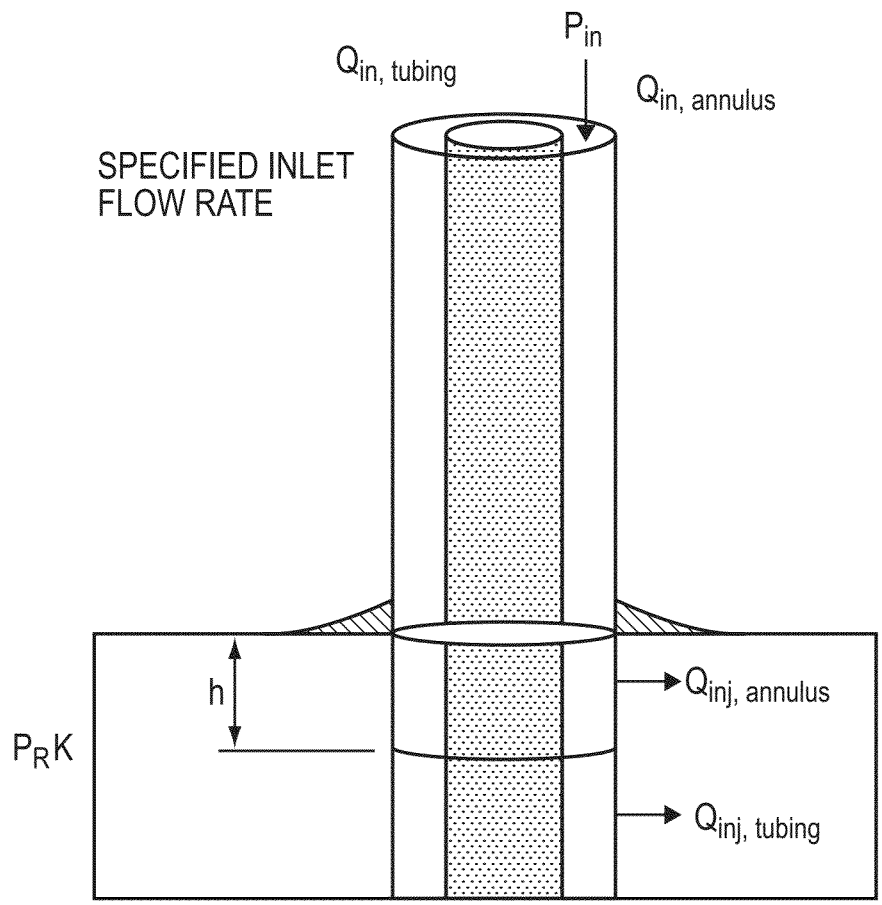
Figure 11E:
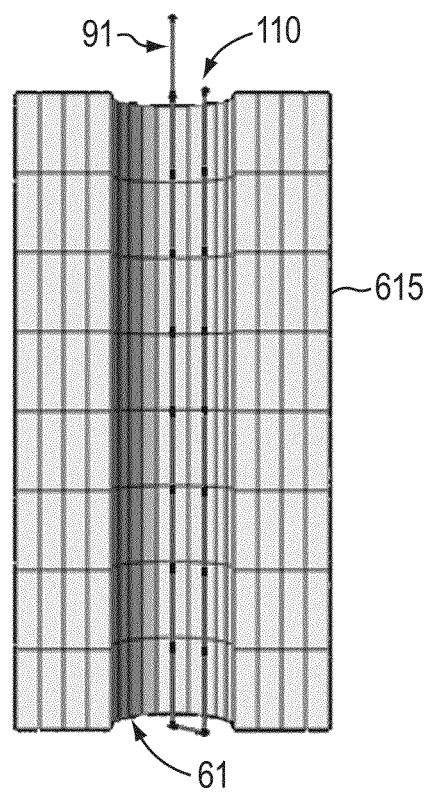
FIG. 11E is a longitudinal section view of a mesh model of a borehole employed in embodiments.

FIGS. 11C and D illustrate pipe elements 91 configured with annulus in wellbore model 71. The model 71 defines downstream pressures and flow rates ($P_{inj}$, $Q_{inj, \, tubing}$ $Q_{inj, \, annulus}$ based on user-specified inlet pressures ($P_{in}$) or annulus flow rates ($Q_{in \, annulus}$) and the tubing flow rate ($Q_{in \, tubing}$). FIG. 11C illustrates a horizontal injection zone in addition to vertical borehole portion of the modeled wellbore 71.

With reference to FIGS. 7A-10, three example borehole 110 workflows modeled by simulation system 100 in simulating pressure induced fracture are described next. The following descriptions are in terms of a computer process or software routine for purposes of illustration and not limitation.

Borehole Workflow—Example Model 1

This borehole 110 workflow model uses pipe elements 91, enriched regions (XFEM), tie constraints, distributed mechanical load, and the automatic application of the pore pressure DOF (degree of freedom) to hydraulic pressure induced fracture surfaces.

Figure 7A:
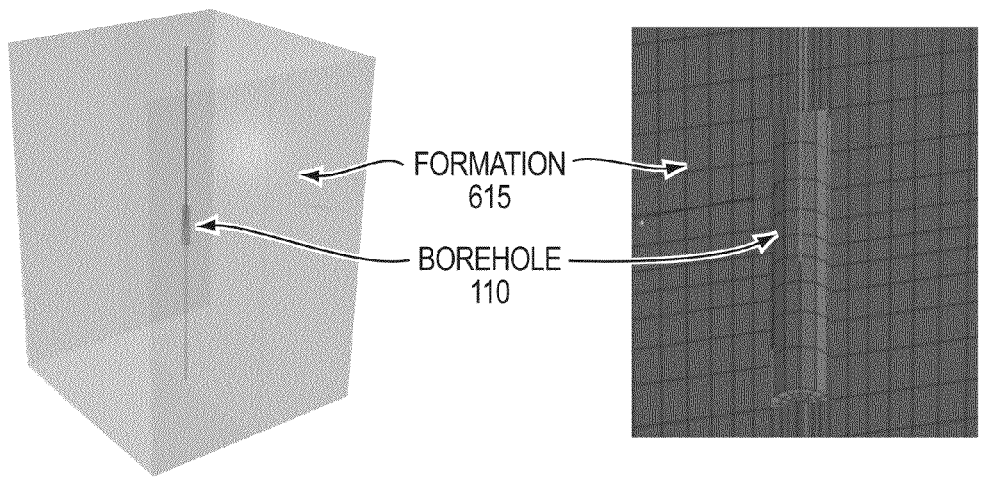
FIGS. 7A-7B are schematic views illustrating one borehole workflow utilized in embodiments.

Step 1: Create a 2D or 3D mesh of the formation 615 and a mesh of 1D pipe elements 91 as shown in FIG. 7A. The formation 615 is modeled as a porous material in which fluid moves through and/or as an impermeable material. The pipe elements 91 are used to model the flow of fluid down the borehole 110.

Step 2: Activate the XFEM (Extended Finite Element Method) capability by marking one or more regions of the formation 615.

Activating the XFEM (Extended Finite Element Method) capability enables the regular finite elements to fracture by enriching degrees of freedom through phantom nodes at the element corners and edges. When the coupled pore pressure elements fracture, the degrees of freedom at the phantom nodes become active enabling the fluid continuity and equilibrium equations inside the fracture to be automatically satisfied. Further implementation details of this enriching technique are found in pending U.S. patent application Ser. No. 13/491,164 for "Hydraulic Fracture Simulation With An Extended Finite Element Method" by Assignee herein incorporated by reference in its entirety.

Figure 7B:
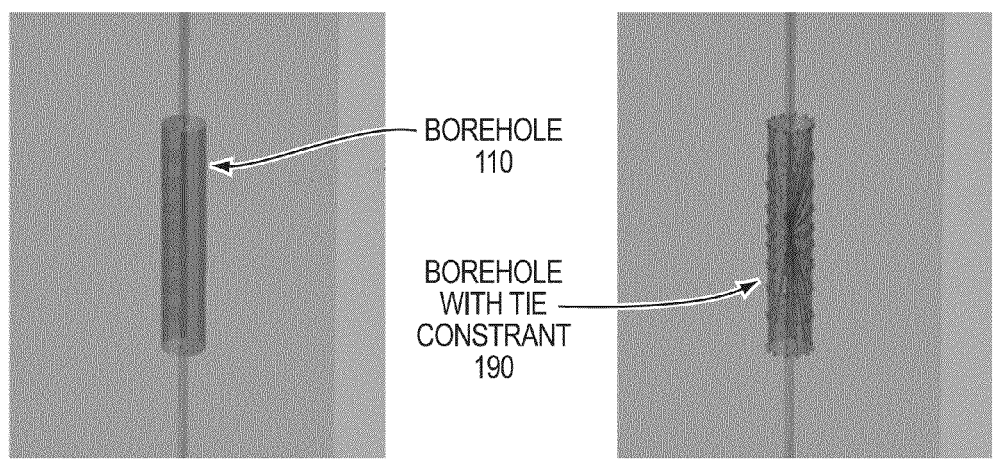

Step 3: Automatically couple the pore pressure fields of the pipe elements 91 to the formation 615 using a tie constraint 190 as illustrated in FIG. 7B. The tie constraint 190 couples a user-specified surface 61 (FIG. 11E) of the formation 615 to a pipe element 91 such that pressure degrees of freedom from the pipe element 91 are tied to the formation 615.

The tie functionality automatically couples the fluid continuity and equilibrium equations between the borehole 110 (pipe elements 91) and the formation 615 (pore pressure elements in the finite element mesh).

The tie functionality also automatically couples the fluid continuity and equilibrium equations between the borehole 110 and any resulting fractures 93 (and cracks 81).

Step 4: Activate the distributed mechanical pressure load on the surface 61 (FIG. 11E) of the formation 615 using the virtual external work term ($\delta W^{External}$) over surface A given by:

$$\delta W^{External} = \int_A \delta u \cdot p n dA \qquad \text{Eq. 4}$$

where: p is the pore pressure interpolated to the element surfaces from the element nodes, n is the surface normal, dA is the infinitesimal surface area, and $\delta u$ is virtual displacement.

The mechanical pressure load automatically converts the simulation solution dependent pore pressure and applies it as a mechanical pressure to the surface 61 of the formation 615.

Figure 8A:
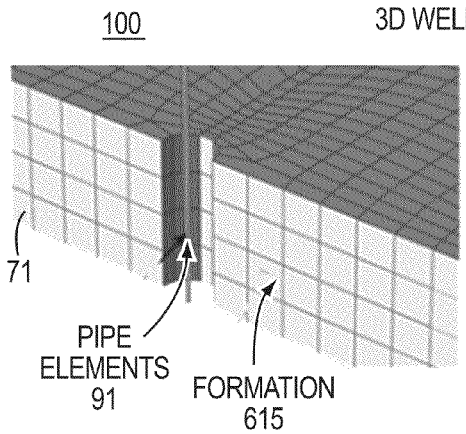
FIGS. 8A-8C are schematic views of simulation results modeling the borehole workflow of FIGS. 7A-7B.
Figure 8B:
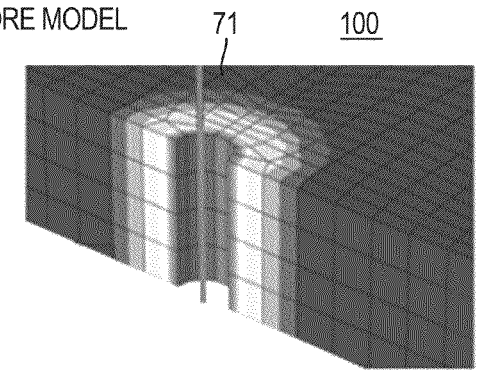
Figure 8C:
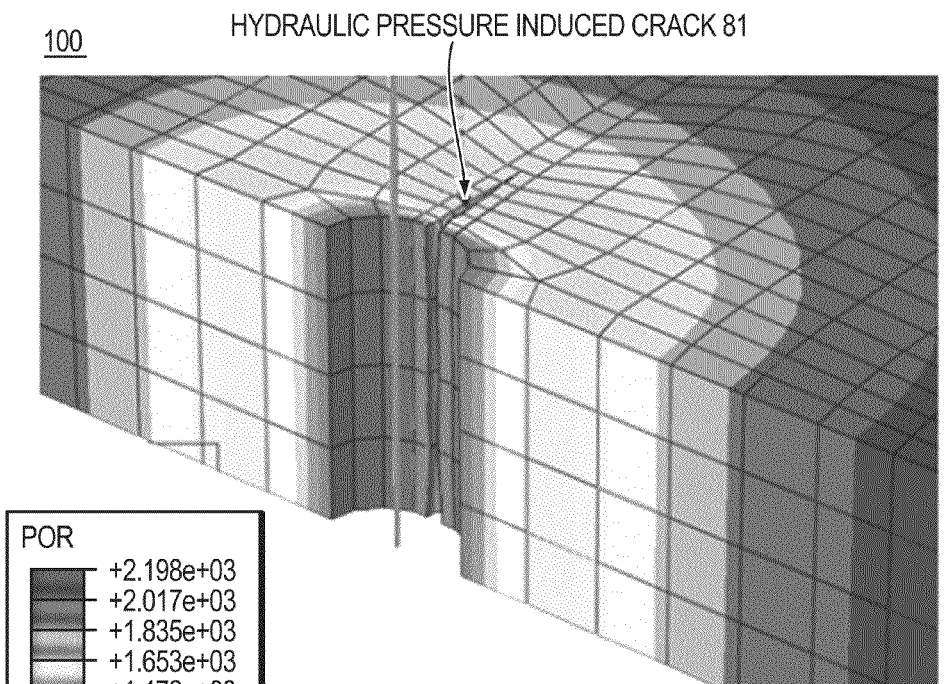

Step 5: Run the analysis (3D Simulator System 75)—example numerical and graphical results are shown in FIGS. 8A-8C.

Borehole Workflow—Example Model 2

This borehole workflow 110 model uses pipe elements 91, *EMBEDDED ELEMENT constraints, enriched regions (XFEM), and the automatic application of the pore pressure DOF to hydraulic pressure induced fracture surfaces.

Step 1: Create a 2D or 3D mesh of the formation 615 and a mesh of 1D pipe elements 91 illustrated in FIG. 9A.

The formation 615 is modeled as a porous material in which fluid moves through and/or as an impermeable material.

The pipe elements 91 are used to model the flow of fluid down the borehole 110.

Step 2: Activate the XFEM capability by marking one or more regions of the formation 615.

Activating the XFEM capability enables the regular finite elements to fracture by enriching degrees of freedom through phantom nodes at the element corners and edges. When the coupled pore pressure elements fracture, the degrees of freedom at the phantom nodes become active, enabling the fluid continuity and equilibrium equations inside the fracture are automatically satisfied. Further details of this enriching technique are found in pending U.S. patent application Ser. No. 13/491,164 by assignee cited above.

Step 3: Automatically couple the pore pressure fields of the pipe elements 91 to the formation 615 using the *EMBEDDED ELEMENT equation (Eq. 5) below. Equation 5 shows the embedded constraint for a 4-noded element. The constraint can be used on any arbitrary n-noded element in two or three dimensions.

Figure 9A:
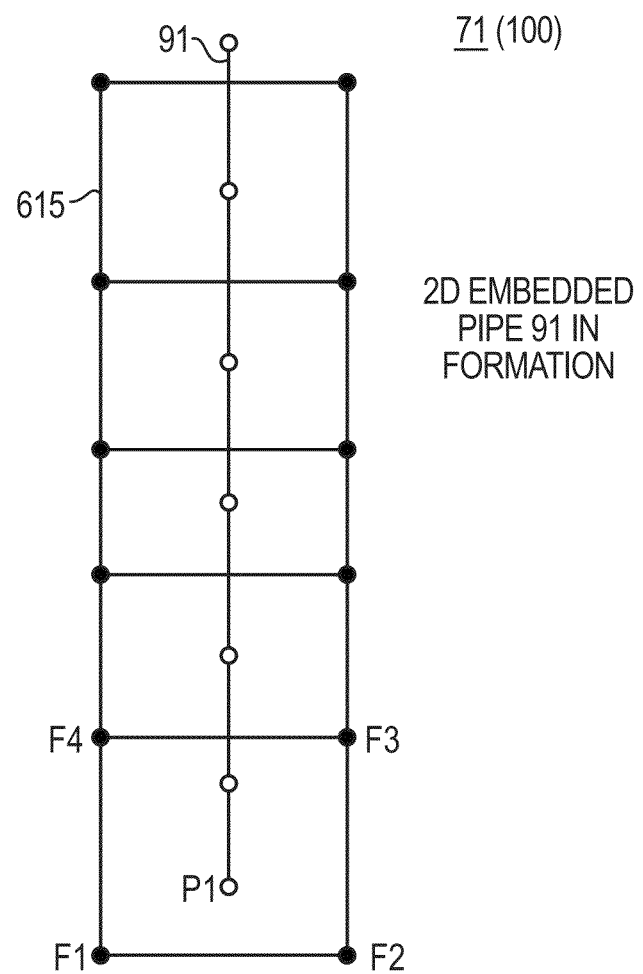
FIGS. 9A-9C are schematic views of wellbore modeling using another borehole workflow in embodiments.

With reference to FIG. 9A, if the node (pipe end) P1 with coordinates ($\epsilon$, $\eta$) from the pipe elements 91 is chosen as the embedded node inside a pore pressure element (F1-F2-F3-F4 of FIG. 9A) of formation 615, then the degrees of node P1 are constrained based on a geometric coupling from nodes F1, F2, F3, and F4. The geometric coupling is based on the shape functions $N_1$ being evaluated at the location of node P1 as shown in Equation 5.

$$P_1 = N_1(\epsilon,\eta) P_{F1} + N_2(\epsilon,\eta) P_{F2} + N_3(\epsilon,\eta) P_{F3} + N_4(\epsilon,\eta) P_{F4} \qquad \text{(EQ. 5)}$$

The embedded element functionality automatically couples the fluid continuity and equilibrium equations between the borehole 110 (pipe elements 91) and the formation 615 based on the geometric relationships between nodes on the pipe elements 91 and those on the formation 615.

The embedded element functionality also automatically couples the fluid continuity and equilibrium equations between the borehole 110 and any resulting fractures 93.

Figure 9B:
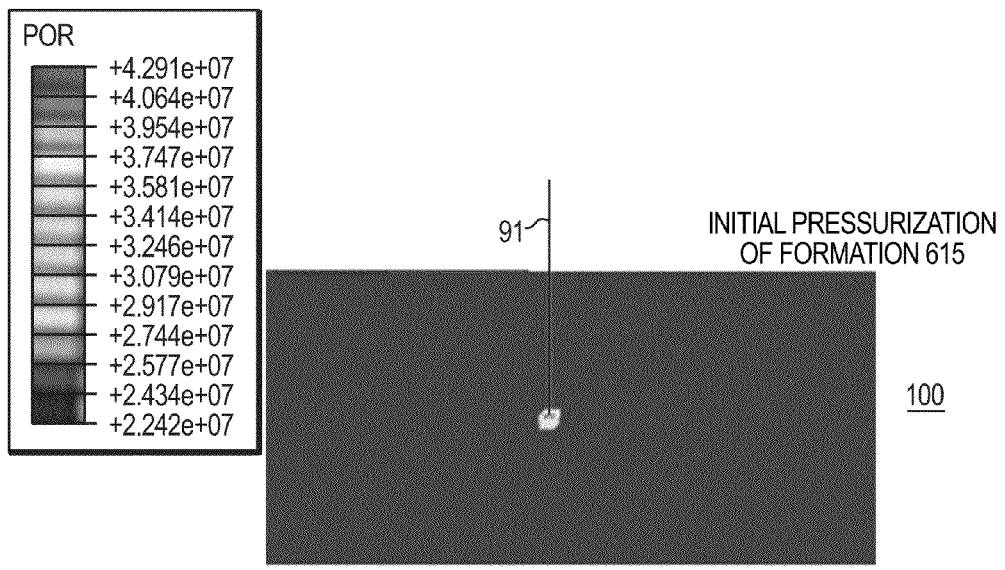
Figure 9C:
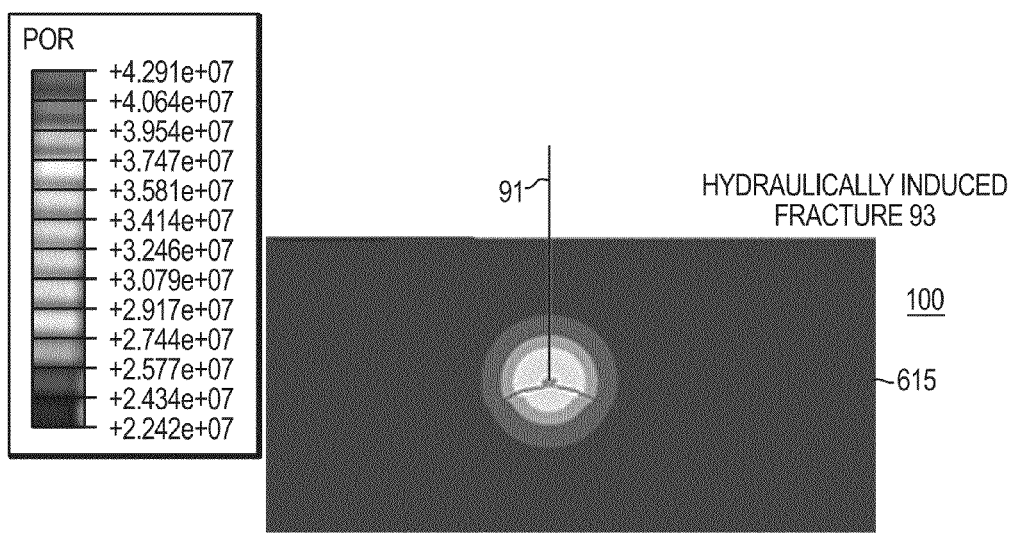

Step 4: Run the simulation analysis by simulator 75. Example numerical and graphical results shown in FIGS. 9B-C are for a 2D case.

Borehole Workflow—Example Wellbore Model 3

The example workflow 110 model uses pipe elements, cohesive elements, tie constraints, and distributed mechanical load.

Figure 10:
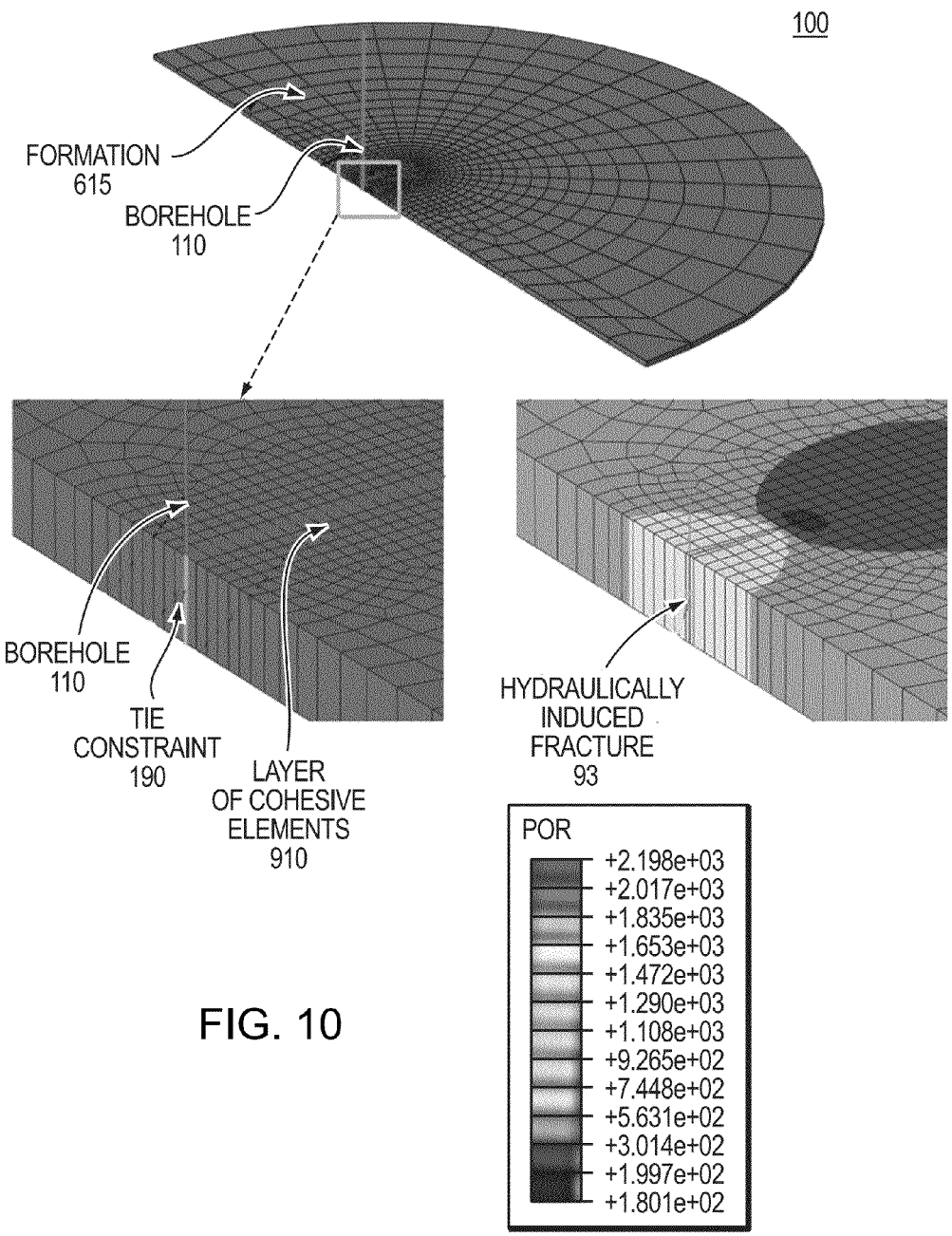
FIG. 10 is a schematic illustration of wellbore modeling using another borehole workflow and resulting simulation results of pressure induced fracture.

Step 1: Create a 2D or 3D mesh of the formation 615 and a mesh of 1D pipe elements 91 as illustrated in FIG. 10.

The formation 615 is modeled as a porous material in which fluid moves through and/or as an impermeable material.

The pipe elements 91 are used to model the flow of fluid down the borehole 110.

Step 2: Include one or more layers of coupled pore pressure cohesive elements (CZM) 910 to model the fracture 93.

When the coupled pore pressure cohesive elements 910 fracture, the fluid continuity and equilibrium equations inside the fracture 93 are automatically satisfied.

Step 3: Automatically couple the pore pressure fields of the pipe elements 91 to the formation 615 and coupled pore pressure cohesive elements 910 using the tie constraints described above in FIG. 7B. An example tie constraint 190 is illustrated in FIG. 10.

The tie functionality automatically couples the fluid continuity and equilibrium equations between the borehole 110 (pipe elements 91) and the formation 615.

The tie functionality also automatically couples the fluid continuity and equilibrium equations between the borehole 110 and any resulting fractures 93.

Step 4: Activate the distributed mechanical pressure load on the surface 61 of the formation 615 using the virtual external work term (Eq. 4) described above.

The mechanical pressure load automatically converts the simulation solution dependent pore pressure and applies it as a mechanical pressure to the surface 61 of the formation 615.

Step 5: Run the analysis by simulator 75—example numerical and graphical results are shown in FIG. 10.

Embodiments of the present invention solve a number of issues as follows. Embodiments provides two techniques (tie constraints and *EMBEDDED ELEMENTS) to automatically couple the flow equations from the pipe element(s) 91 to the formation 615. Embodiments support both XFEM (Finite Element) models with enriched regions as well as models with coupled pore pressure-displacement cohesive elements (CZM).

Embodiments also provide a way to automatically apply a mechanical hydrostatic pressure using the model solution dependent pore pressure DOFs. This is important because the mechanical pressure affects the stress field which in turn controls the initiation and evolution of fracture. In addition, the pore pressure in the well-bore is not known a priori, it is part of the solution. Therefore without an automatic way to apply the correct pore pressure, an individual running an analysis would have to guess what pressures to apply in the borehole.

Finally embodiments allow for the automatic application of pore pressure from the modeled borehole 71 to cracks in the formation where pore pressure DOFs begin to activate, enabling the fluid continuity and equilibrium equations inside the fracture to be automatically satisfied.

FIG. 12 is a schematic block diagram of an exemplary computer-aided design station 300, which may also be referred to herein as a computer system. As used herein, the terms "computer-aided design station" and "computer system" refer generally to any suitable computing device that may be used to perform the processes described above and/or any additional processes that may be related to those described above.

In an exemplary embodiment, the computer-aided design station 300 includes one or more processors 302 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a non-transitory computer-readable medium, such as a memory area 304 that is operably and/or communicatively coupled to the processor 302 by a system bus 306. A "memory area," as used herein, refers generally to any means of storing program code and instructions executable by one or more processors to aid in modeling borehole work flow and therefrom simulating pressure induced fracture. The memory area 304 may include one, or more than one, forms of memory. For example, the memory area 304 may include random-access memory (RAM) 308, which can include non-volatile RAM, magnetic RAM, ferroelectric RAM, and/or other forms of RAM. The memory area 304 may also include read-only memory (ROM) 310 and/or flash memory and/or electrically-erasable programmable read-only memory (EEPROM). Any other suitable magnetic, optical, and/or semiconductor memory, such as a hard-disk drive (HDD) 312, by itself or in combination with other forms of memory, may be included in the memory area 304. HDD 312 may also be coupled to a disk controller 314 for use in transmitting and receiving messages to and from processor 302. Moreover, the memory area 304 may also be, or may include, a detachable or removable memory 316, such as a suitable cartridge disk, CD-ROM, DVD, or USB memory. The above examples are exemplary only and, thus, are not intended to limit in any way the definition and/or meaning of the term "memory area."

The computer-aided design station 300 also includes a display device 318 that is coupled, such as operably coupled, to a display controller 320. The display controller 320 receives data via the system bus 306 for display by the display device 318. The display device 318 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 318 may include a touchscreen with an associated touchscreen controller. The above examples are exemplary only and, thus, are not intended to limit in any way the definition and/or meaning of the term "display device."

In addition, the computer-aided design station 300 includes a network interface 322 for use in communicating with a network (not shown in FIG. 12). Moreover, the computer-aided design station 300 includes one or more input devices, such as a keyboard 324 and/or a pointing device 326, such as a roller ball, mouse, touchpad, and the like. The input devices are coupled to and controlled by an input/output (I/O) interface 328, which is further coupled to the system bus 306.

A description of the general features and functionality of the display device 318, keyboard 324, pointing device 326, as well as the display controller 320, disk controller 314, network interface 322, and I/O interface 328 is omitted herein for brevity as these features are known.

Figure 13:
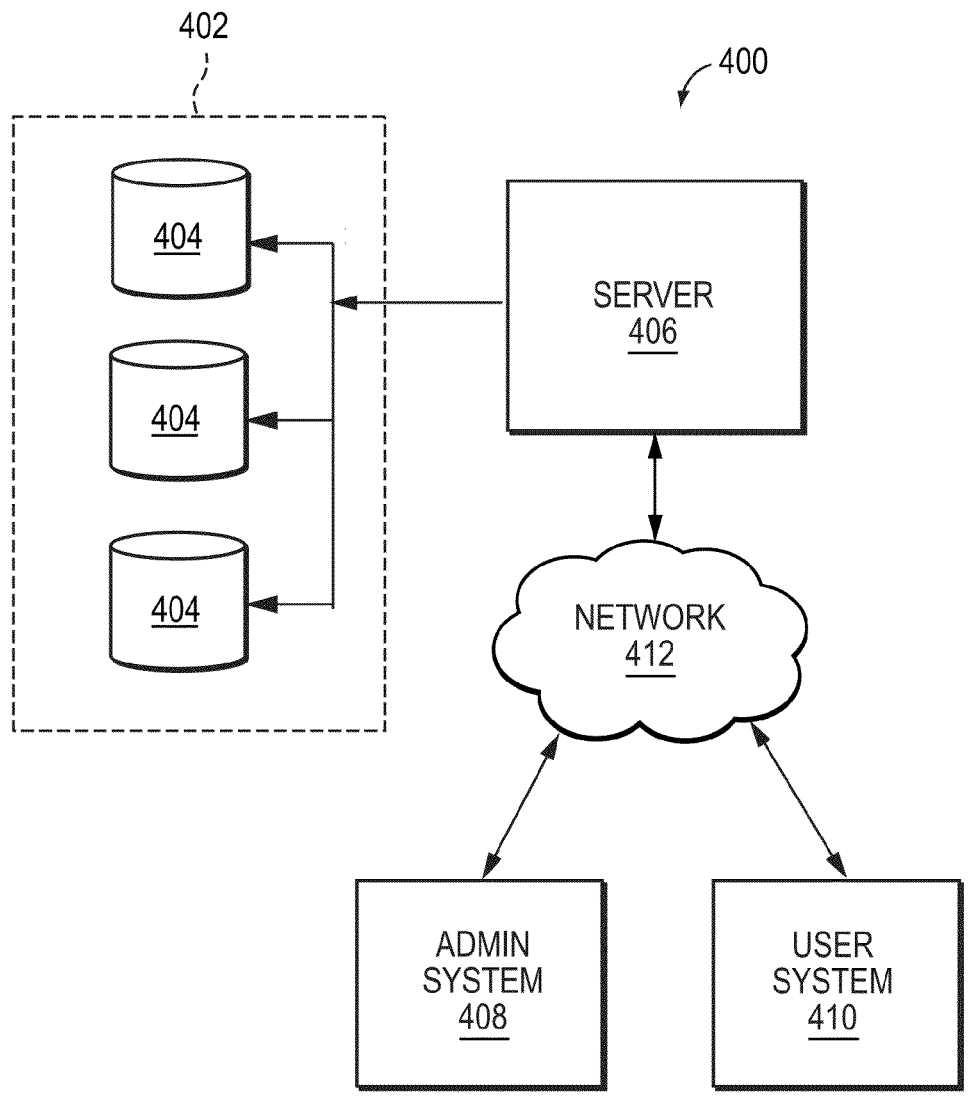

FIG. 13 is a schematic block diagram of an exemplary system 400 for use in updating computer-aided design of a modeled object, such as the processes described above and/or additional processes that may be related to those described above. In an exemplary embodiment, a memory area 402 includes one or more storage devices 404 for use in storing CAD data, such as wellbore model 71 data, and borehole 110 workflow data, and/or simulation data of pressure induced fracture as related to the wellbore/borehole. In some embodiments, the memory area 402 is coupled to a server 406, which is in turn coupled to an administrator system 408 and/or a user system 410 via a network 412. The storage devices 404 may be embodied as one or more databases, may be located at a single or at multiple geographical sites, or may be integrated with the server 406.

As can be appreciated, the network 412 can be a public network, such as the Internet, or a private network such as an LAN or WAN network, or any combination thereof and can also include PSTN or ISDN sub-networks. The network 412 can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network 412 is merely exemplary and in no way limits the scope of the present advancements.

As one of ordinary skill in the art would recognize, the administrator system 408 and/or the user system 410 can be a computer-aided design station such as the one described above with reference to FIG. 12, or any other computing system that is known. Moreover, it should be understood that the administrator system 408 and/or the user system 410 are configured to perform the processes described above and/or any additional processes that may be related to those described above.

The server 406 stores the computer-readable instructions to execute the processes described above and provides these instructions via the network 412 to the administrator system 408 and/or the user system 410. Moreover, the server 406 can also provide data from the memory area 402 as needed to the administrator system 408 and the user system 410. As such, FIG. 13 includes implementations of the system 400 via cloud computing, distributed computing and the like.

Exemplary embodiments of systems, methods, apparatus, computer program products, and computer-readable storage media for use in computer-aided design of a modeled object are described above in detail. The systems, methods, apparatus, computer program products, and computer-readable storage media are not limited to the specific embodiments described herein but, rather, operations of the methods, program products and/or storage media, as well as components of the system and/or apparatus, may be utilized independently and separately from other operations and/or components described herein. Further, the described operations and/or components may also be defined in, or used in combination with, other systems, methods, apparatus, program products and/or storage media, and are not limited to practice with only the systems, methods, apparatus, program products and storage media as described herein.

A computer or computer system, such as those described herein, includes at least one processor or processing unit and a system memory. The computer or computer system typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of well-known computer systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

While this invention has been particularly shown and described with references to example embodiments thereof, it will be understood by those skilled in the art that various changes in form and details may be made therein without departing from the scope of the invention encompassed by the appended claims.

What is claimed is:

1. A computer method of simulating hydraulic fracturing, comprising:
    modeling a wellbore of a well, including modeling borehole workflow in a subject rock formation, said modeling being computer-automated and implemented by a processor;
    obtaining computer generated pressure values from the wellbore model; and
    automatically simulating pressure induced fracture of the rock formation based on the obtained computer generated pressure values of the wellbore model, said automatic simulating outputting a 2D or 3D graphical representation of fracture in the rock formation;
wherein modeling the wellbore includes:
modeling a hydraulic drill pipe element in a borehole; and
modeling related fluid flow in the borehole; and
wherein the automatic simulating further comprises automatically coupling fluid continuity and flow equilibrium equations from the drill pipe element to the rock formation.

2. A computer method as claimed in claim 1 wherein the well is an injection well.

3. A computer method as claimed in claim 1 wherein the flow equilibrium equations include flow equilibrium between the borehole and a fracture in the rock formation, the fracture being represented by any of an extended finite element method and coupled pore pressure cohesive elements.

4. A computer method as claimed in claim 1 wherein modeling the hydraulic drill pipe element models a series of pipe elements in the borehole workflow.

5. A computer method as claimed in claim 1 wherein automatically simulating pressure induced fracture includes automatically converting pore pressure from the modeled borehole into a mechanical pressure load on the subject rock formation.

6. A computer method as claimed in claim 5 wherein the mechanical pressure load is hydrostatic pressure.

7. A computer method as claimed in claim 5 further comprising automatically applying the mechanical pressure to surface of the rock formation affected by the borehole to define one or more pressure induced fractures in the rock formation.

8. A computer apparatus simulating hydraulic fracturing, comprising:
a processor configured to model a wellbore of a well, including modeling borehole workflow in a subject rock formation, wherein the processor is configured to model the wellbore by: (i) modeling a hydraulic drill pipe element in a borehole, and (ii) modeling related fluid flow in the borehole; and
a computer based simulator coupled to receive computer generated pressure values of the wellbore model from the processor, the simulator configured to automatically simulate pressure induced fracture of the rock formation based on the received computer generated pressure values, and to provide graphical output display to a user illustrating the simulated pressure induced fracture, wherein the simulator is further configured to automatically couple fluid continuity and flow equilibrium equations from the drill pipe element to the rock formation.

9. A computer apparatus as claimed in claim 8 wherein the well is an injection well.

10. A computer apparatus as claimed in claim 8 wherein the flow equilibrium equations include flow equilibrium between the borehole and a fracture in the rock formation, the fracture being represented by any of an extended finite element method and coupled pore pressure cohesive elements.

11. A computer apparatus as claimed in claim 8 wherein the processor is configured to model the hydraulic drill pipe element by modeling a series of pipe elements in the borehole workflow.

12. A computer apparatus as claimed in claim 8 wherein the simulator is configured to automatically simulate pressure induced fracture by automatically converting pore pressure from the modeled borehole into a mechanical pressure load on the subject rock formation.

13. A computer apparatus as claimed in claim 12 wherein the mechanical pressure load is hydrostatic pressure.

14. A computer apparatus as claimed in claim 12 wherein the simulator is further configured to automatically apply the mechanical pressure to surface of the rock formation affected by the borehole to define one or more pressure induced fractures in the rock formation.

15. A computer apparatus as claimed in claim 8 wherein the graphical output display is a 2D or 3D representation of fracture in the subject rock formation.

* * * * *